US011233098B2

(12) United States Patent
Xu et al.

(10) Patent No.: US 11,233,098 B2
(45) Date of Patent: Jan. 25, 2022

(54) DISPLAY ARRAY SUBSTRATE, METHOD FOR MANUFACTURING THE SAME AND DISPLAY INCLUDING THE SAME

(71) Applicant: BOE Technology Group Co., Ltd., Beijing (CN)

(72) Inventors: Rui Xu, Beijing (CN); Haisheng Wang, Beijing (CN); Yingming Liu, Beijing (CN); Changfeng Li, Beijing (CN); Wei Liu, Beijing (CN); Qingrong Ren, Beijing (CN); Yu Wen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 473 days.

(21) Appl. No.: 16/078,560

(22) PCT Filed: Jan. 30, 2018

(86) PCT No.: PCT/CN2018/074542
§ 371 (c)(1),
(2) Date: Aug. 21, 2018

(87) PCT Pub. No.: WO2019/000939
PCT Pub. Date: Jan. 3, 2019

(65) Prior Publication Data
US 2020/0335559 A1 Oct. 22, 2020

(30) Foreign Application Priority Data
Jun. 27, 2017 (CN) .......................... 201710501016.4

(51) Int. Cl.
*G06K 9/00* (2006.01)
*H01L 27/32* (2006.01)
(Continued)

(52) U.S. Cl.
CPC ........ *H01L 27/3227* (2013.01); *G06K 9/0004* (2013.01); *H01L 27/1237* (2013.01);
(Continued)

(58) Field of Classification Search
CPC .............. G06K 9/0004; G06K 9/00013; G06F 3/0412; G06F 3/042; G06F 3/0421
See application file for complete search history.

(56) References Cited

U.S. PATENT DOCUMENTS

2009/0078939 A1 3/2009 Yamazaki et al.
2011/0037729 A1* 2/2011 Cho ....................... G06F 3/0412
345/175
(Continued)

FOREIGN PATENT DOCUMENTS

CN 105956584 A 9/2016
CN 105975136 A 9/2016
(Continued)

OTHER PUBLICATIONS

First Office Action and English language translation, CN Application No. 201710501016.4, dated May 8, 2019, 17 pp.
(Continued)

*Primary Examiner* — Yuzhen Shen
(74) *Attorney, Agent, or Firm* — Myers Bigel, P.A.

(57) ABSTRACT

A display array substrate, a manufacturing method and a display are disclosed herein. The display array substrate includes an array substrate base, an electroluminescent diode array substrate arranged above the array substrate base, including an anode layer, a cathode layer, an electroluminescent EL layer between the anode layer and the cathode layer, and a pixel compensation circuit layer on a side close to the array substrate base. The cathode layer is on a side away from the array substrate base. A photosensitive signal collector may be configured to receive an optical signal
(Continued)

reflected by valleys and ridges of a finger and emitted by the electroluminescent EL layer, and convert the collected optical signal into an electrical signal to be output. The photosensitive signal collector may be arranged between the pixel compensation circuit layer and the anode layer of the electroluminescent diode array substrate.

18 Claims, 3 Drawing Sheets

(51) Int. Cl.
      *H01L 27/12*       (2006.01)
      *H01L 51/50*       (2006.01)

(52) U.S. Cl.
      CPC ...... *H01L 27/1248* (2013.01); *H01L 27/3269* (2013.01); *H01L 51/5012* (2013.01)

(56) References Cited

U.S. PATENT DOCUMENTS

| | | | |
|---|---|---|---|
| 2011/0272689 A1* | 11/2011 | Park | H01L 27/1225 257/43 |
| 2017/0372113 A1* | 12/2017 | Zhang | G06K 9/2036 |
| 2018/0217430 A1 | 8/2018 | Ding et al. | |
| 2018/0225497 A1 | 8/2018 | Li et al. | |
| 2019/0004648 A1 | 1/2019 | Xu et al. | |

FOREIGN PATENT DOCUMENTS

| | | |
|---|---|---|
| CN | 106156753 | 11/2016 |
| CN | 106292108 A | 1/2017 |
| CN | 106293244 | 1/2017 |
| CN | 107025451 A | 8/2017 |
| CN | 107256880 | 10/2017 |

OTHER PUBLICATIONS

International Search Report and Written Opinion of the International Searching Authority corresponding to International Patent Application No. PCT/CN2018/074542, dated May 8, 2018. (14 pages with English Translations).

"The Fourth Office Action and English language translation", CN Application No. 201710501016.4, dated Mar. 3, 2021, 15 pp.

* cited by examiner

DISPLAY ARRAY SUBSTRATE, METHOD FOR MANUFACTURING THE SAME AND DISPLAY INCLUDING THE SAME

CROSS REFERENCE TO RELATED APPLICATIONS

The present application is a 35 U.S.C. 371 national stage application of PCT International Application No. PCT/CN2018/074542, filed on Jan. 30, 2018, which claims the priority of Chinese patent application No. 201710501016.4 filed on Jun. 27, 2017, the disclosures of which are hereby incorporated in their entireties by reference.

TECHNICAL FIELD

This disclosure relates to the technical field of display fingerprint identification, and particularly to a display array substrate, a manufacturing method and a display.

BACKGROUND

With the development of the technologies, many display devices such as mobile phones and tablet computers begin to have the fingerprint identification function. In the fingerprint identification technology, fingerprint collection is mainly implemented by optics, capacitor, etc. The fingerprint identification technology which performs fingerprint collection by optics has a relatively large identification range and has a relatively low cost.

The optical fingerprint identification of the current LCD display terminal is mostly integrated on a touch pad (such as the home button) of the non-display region.

SUMMARY

According to an aspect of this disclosure, a display array substrate is provided, comprising: an array substrate base; an electroluminescent diode array substrate arranged above the array substrate base, comprising an anode layer, a cathode layer, an electroluminescent EL layer between the anode layer and the cathode layer, and a pixel compensation circuit layer on a side close to the array substrate base, wherein the cathode layer is on a side away from the array substrate base; and a photosensitive signal collector configured to collect an optical signal reflected by valleys and ridges of a finger and emitted by the electroluminescent EL layer, and convert the collected optical signal into an electric signal for output, wherein the photosensitive signal collector is arranged between the pixel compensation circuit layer and the anode layer of the electroluminescent diode array substrate.

In one embodiment, the photosensitive signal collector comprises: a photoelectric sensor unit and a switch unit. The photoelectric sensor unit can be configured to collect an optical signal reflected by valleys and ridges of a finger and emitted by the EL layer, convert the collected optical signal into an electric signal, and output it upon receiving a control signal of the switch unit. The switch unit can be configured to send a control signal to the photoelectric sensor unit, the control signal being used for triggering the photoelectric sensor unit to output the electric signal.

In one embodiment, the photoelectric sensor unit can be arranged above the switch unit.

In one embodiment, the pixel compensation circuit can comprise a low temperature poly-silicon thin film transistor. The switch unit can comprise an oxide thin film transistor.

In one embodiment, the photoelectric sensor unit can comprise a photodiode. The photodiode can comprise: a first electrode, a photosensitive material layer and a second electrode. The first electrode is connected with a source of the oxide thin film transistor, and the second electrode is connected with a power supply providing a constant voltage. A gate of the oxide thin film transistor is connected with a control signal line, and a control signal on the control signal line is used for controlling turn-off or turn-on of the oxide thin film transistor. A drain of the oxide thin film transistor is connected with a data reading signal line used for collecting a current signal outputted by the photoelectric sensor unit.

In one embodiment, the array substrate can further comprise: a plurality of photosensitive signal collectors distributed in an array in the array substrate.

According to another aspect of this disclosure, a method for manufacturing a display array substrate is provided, comprising:

forming a pixel compensation circuit layer on an array substrate base;

forming a structure layer comprising a photosensitive signal collector in an upper layer of the pixel compensation circuit layer wherein the photosensitive signal collector can be configured to collect an optical signal reflected by valleys and ridges of a finger and emitted by an electroluminescent EL layer, and convert the collected optical signal into an electric signal to be output;

forming an anode layer above the structure layer comprising the photosensitive signal collector, forming an EL layer above the anode layer, and forming a cathode layer above the EL layer.

In one embodiment, the photosensitive signal collector comprises a photoelectric sensor unit and a switch unit. The photoelectric sensor unit can be configured to collect an optical signal reflected by valleys and ridges of a finger and emitted by the EL layer, convert the collected optical signal into an electric signal, and output it upon receiving a control signal of the switch unit. The switch unit can be configured to send a control signal to the photoelectric sensor unit, the control signal being used for triggering the photoelectric sensor unit to output the electric signal.

In one embodiment, the process of forming a pixel compensation circuit layer on the array substrate base comprises: forming a low temperature poly-silicon thin film transistor on the array substrate base through the following process: forming a poly-silicon active layer on the array substrate base; forming a first gate insulator covering the poly-silicon active layer; forming a first gate on the first gate insulator; forming an inter layer dielectric covering the first gate; forming a first source and a first drain on the inter layer dielectric, the first source and the first drain being connected with the poly-silicon active layer through vias arranged on the inter layer dielectric and the first gate insulator; forming, on the inter layer dielectric, a passivation layer covering the first source and the first drain.

In one embodiment, the process of forming a structure layer comprising a photosensitive signal collector in an upper layer of the pixel compensation circuit layer comprises: forming a first structure layer comprising a switch unit in the upper layer of the pixel compensation circuit layer, and forming a second structure layer comprising a photoelectric sensor unit in an upper layer of the first structure layer.

In one embodiment, the process of forming a first structure layer comprising a switch unit in the upper layer of the pixel compensation circuit layer comprises: forming a first structure layer comprising an oxide thin film transistor in the upper layer of the pixel compensation circuit layer through the following process: forming a second gate in the upper layer of the pixel compensation circuit layer; forming a second gate insulator covering the second gate; forming an oxide active layer on the second gate insulator; forming a second source and a second drain in a same layer as the oxide active layer, the second source and the second drain being connected with the oxide active layer; forming, on the oxide active layer, a resin layer covering the second source and the second drain; connecting a gate of the oxide thin film transistor with a control signal line, a control signal on the control signal line being used for controlling turn-off or turn-on of the thin film transistor; connecting a drain of the oxide thin film transistor with a data reading signal line used for collecting a current signal outputted by the photoelectric sensor unit.

In one embodiment, the process of forming a second structure layer comprising a photoelectric sensor unit in an upper layer of the first structure layer comprises: forming a second structure layer comprising a photodiode in the upper layer of the first structure layer through the following process: successively forming a first electrode, a photosensitive material layer and a second electrode of the photodiode in the upper layer of the first structure layer; connecting the first electrode of the photodiode with a source of the oxide thin film transistor, and connecting the second electrode of the photodiode with a power supply providing a constant voltage.

According to another aspect of this disclosure, a display is provided, comprising the above display array substrate.

The Summary introduces some concepts of the present invention briefly. These concepts will be further described in the following detailed description. The Summary is not intended to give essential features or substantive features of the claimed subject matter, nor intended to limit the scope of the claimed subject matter. Also, just as described herein, various other features and advantages can also be combined into these technologies as needed.

Some other features and advantages of the present invention will be set out in the later description, or can be obtained and understood by reading the description or by carrying out the present invention. These objects and other advantages of the present invention can be realized and obtained through structures or equivalences particularly pointed out in the description, the Claims and the drawings.

BRIEF DESCRIPTION OF THE DRAWINGS

The drawings are used for providing further understanding to the technical solutions of this disclosure, and constitute a part of the description for explaining the technical solutions of this disclosure along with the embodiments of the present application. It should be aware that the drawings described below only involve some embodiments, and do not constitute limitations to the technical solutions of this disclosure. The ordinary skilled person in the art can also obtain other drawings based on these drawings without undue experimentation. The other drawings also fall within the scope of the present invention.

DETAILED DESCRIPTION

In order to enable the objects, the technical solutions and the advantages of the present invention to be more explicit, embodiments of this disclosure will be explained below in detail in conjunction with the drawings. It should be noted that in the case of no conflict, the embodiments in the present application and the features in the embodiments can be combined with each other arbitrarily.

The steps shown in the flow chart of the drawings can be performed in the computer system by control of a group of computer executable instructions for example. Although the logical order for performing these steps have been shown in the flow chart, in some cases, the steps shown or described can be performed in an order different from the order herein.

At present, organic light-emitting diode (OLED) devices have become the next generation display technology with great competitiveness and development prospects since it has a series of advantages such as an all-solid-state structure, high brightness, full view, a rapid response speed, flexible display. The basic structure of the OLED is a structure like a sandwich formed by a thin and transparent indium tin oxide (ITO) with semiconductor properties connected with an anode and another cathode. The whole structure layers include: a hole transport layer (HTL), an electroluminescent (EL) layer and an electron transport layer (ETL). When an appropriate voltage is reached by power supply, anode holes and cathode charges are combined in the light emitting layer thus generating light. Three primary colors of red, green and blue (RGB) are generated according to its different formulation, so as to form basic colors. A characteristic of the OLED is emitting light by itself, unlike the TFT LCD which needs backlight.

Figure 1:
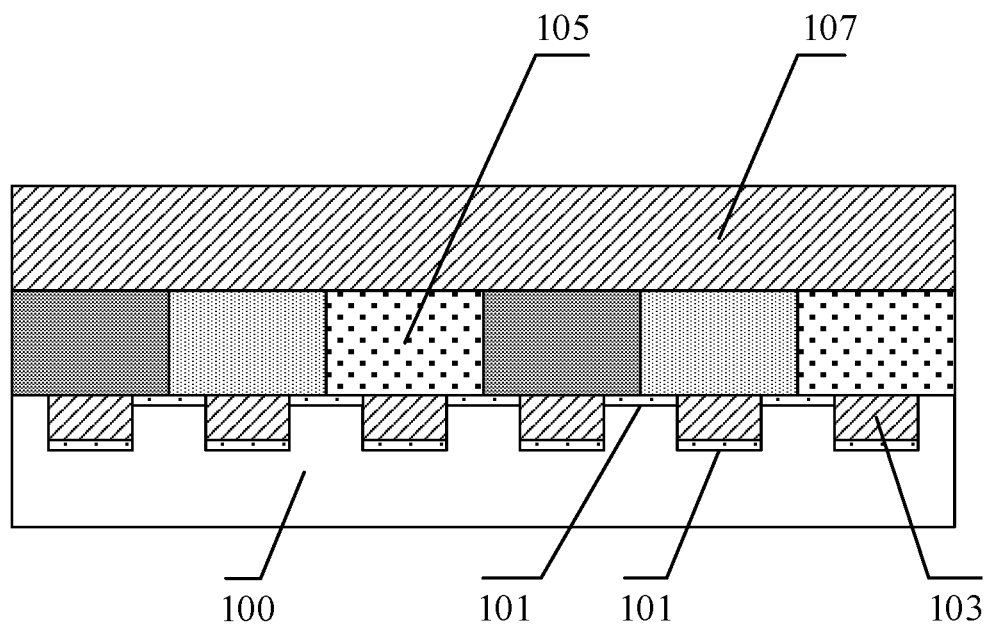
FIG. 1 is a structural schematic view of an OLED device of the related art.

As shown in FIG. 1, the structure of the existing OLED device includes successively from base to top: an array substrate base 100, a pixel compensation circuit 101, an anode 103, an electroluminescent EL layer 105 and a cathode 107. A plurality of pixel units are arranged in the EL layer 105. Each pixel unit can include three sub-pixel units of R (red), G(green) and B (blue).

Figure 2:
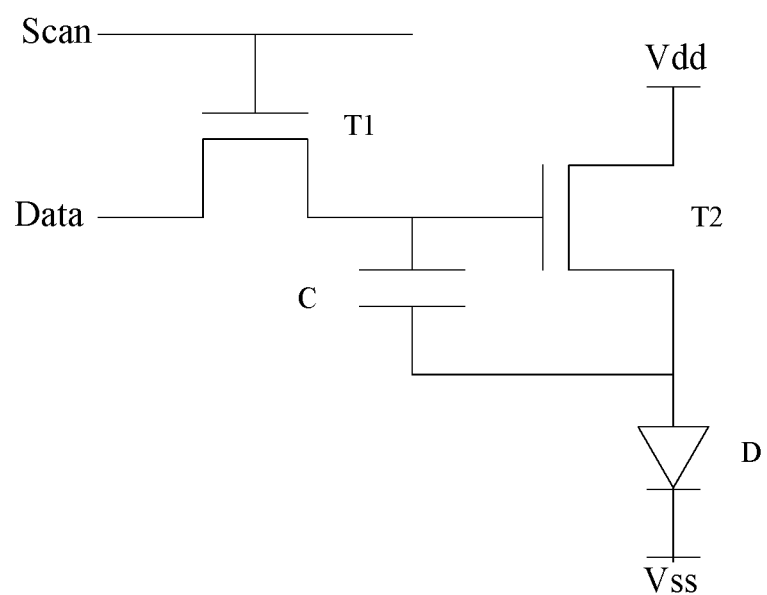
FIG. 2 is a schematic view of principle of a pixel compensation circuit of the OLED of the related art.

As shown in FIG. 2, the pixel compensation circuit can use the 2T1C structure or other structures. Take the 2T1C structure as an example, the pixel compensation circuit comprises a first thin film transistor T1, a capacitor C and a second thin film transistor T2. A gate of the first thin film transistor T1 is electrically connected to a gate line Scan. A source is electrically connected to a data signal line Data. A drain is electrically connected with a gate of the second thin film transistor T2 and one terminal of the capacitor C. A source of the second thin film transistor T2 is electrically connected to a high voltage terminal Vdd. A drain is electrically connected to an anode of an organic light emitting diode D. A cathode of the organic light emitting diode D is electrically connected to a common ground electrode Vss. One terminal of the capacitor C is electrically connected to the drain of the first thin film transistor T1, and the other terminal is electrically connected to the drain of the second thin film transistor T2. In display, the gate line Scan controls the first thin film transistor T1 to be ON, and the data signal voltage of the data signal line Data enters the gate of the second thin film transistor T2 and the capacitor C through the first thin film transistor T1. Then the first thin film transistor T1 is OFF. Due to the effect of the capacitor C, the gate voltage of the second thin film transistor T2 can still maintain the data signal voltage, so as to enable the second thin film transistor T2 to be in a turn-on state. The driving current corresponding to the high voltage signal terminal Vdd and the data signal voltage enters the organic light emitting diode D through the second thin film transistor T2, so as to drive the organic light emitting diode D to emit light.

It is desired in the art to realize a new fingerprint identification scheme in the OLED display, which can get rid of the limitation of the mechanical button, and can implement fingerprint collection within a full screen range of a display screen.

Figure 3:
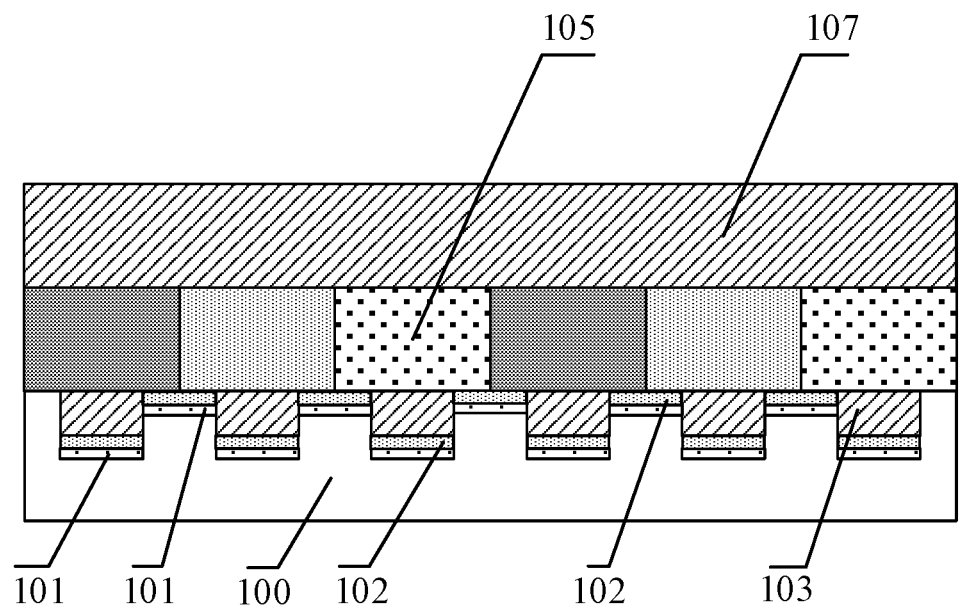
FIG. 3 is a schematic view of a display array substrate in an embodiment of this disclosure.

FIG. 3 shows a schematic view of a display array substrate in an embodiment of this disclosure. As shown in FIG. 3, the display array substrate can comprise a photosensitive signal collector 102 which can be configured to collect an optical signal reflected by valleys and ridges of a finger and emitted by an electroluminescent EL layer 105, and convert the collected optical signal into an electric signal to be outputted. The photosensitive signal collector 102 can be arranged between a pixel compensation circuit layer 101 and an anode layer 103 of the electroluminescent diode array substrate. The EL layer 105 is between the anode layer 103 and a cathode layer 107. The pixel compensation circuit layer 101 is on a side close to an array substrate base 100, and the cathode layer 107 is on a side away from the array substrate base 100.

In one implementation, the display array substrate can comprise a plurality of photosensitive signal collectors which are distributed in an array in the array substrate.

In one implementation, the photosensitive signal collector can comprise: a photoelectric sensor unit and a switch unit. The photoelectric sensor unit can be configured to collect an optical signal reflected by valleys and ridges of a finger and emitted by the EL layer, convert the collected optical signal into an electric signal, and output it upon receiving a control signal of the switch unit. The switch unit can be configured to send to the photoelectric sensor unit a control signal which is used for triggering the photoelectric sensor unit to output an electric signal.

Some embodiments of this disclosure provide a display array substrate, a manufacturing method and a display. Photosensitive signal collectors are distributed in an array between the pixel compensation circuit layer and the electroluminescent EL layer of the OLED array substrate, so as to collect an optical signal reflected by the valleys and ridges of the finger and emitted by the electroluminescent EL layer, and convert the collected optical signal into an electric signal to be output, thus implementing fingerprint collection within a screen range, or a full screen range of the display screen.

Figure 4:
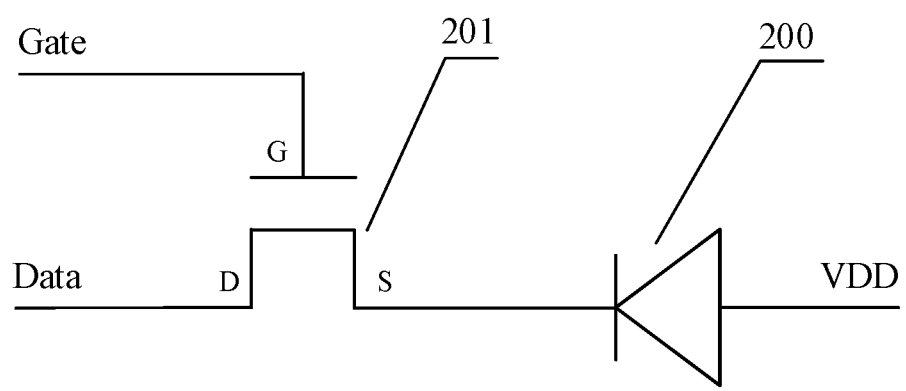
FIG. 4 is a schematic view of connection of a photodiode and a switch unit in an embodiment of this disclosure.

FIG. 4 shows a schematic view of connection of a photodiode and a switch unit in an embodiment of this disclosure. As shown in FIG. 4, the photoelectric sensor unit can comprise a photodiode 200. The switch unit can comprise a thin film transistor 201. The photodiode 200 can comprise: a first electrode, a photosensitive material layer and a second electrode. The thin film transistor 201 can comprise: a gate (G), a source (S) and a drain (D). The first electrode of the photodiode 200 is connected with the source of the thin film transistor 201, and the second electrode of the photodiode 200 is connected with a power supply (VDD) which provides a constant voltage.

The gate of the thin film transistor 201 can be connected to a control signal line (Gate). A control signal on the control signal line is used for controlling turn-off or turn-on of the thin film transistor. The drain of the thin film transistor 201 can be connected to a data reading signal line (Date) which is used for collecting a current signal outputted by the photoelectric sensor unit.

The photodiode 200 can convert an optical signal into a current signal. When the thin film transistor 201 is ON, the current signal is outputted through the thin film transistor 201. When the thin film transistor 201 is OFF, no current signal is outputted. When a light source irradiates onto a finger, due to a difference between a valley and a ridge of a fingerprint, different reflections will be generated, thereby causing intensity of light arriving at the photodiode to be different, thus resulting in different photocurrents. In the array structure formed by a plurality of photosensitive signal collectors, through control of the thin film transistor 201, photodiodes 200 successively output current signals so as to carry out detection of the valley and the ridge of the fingerprint.

In some embodiments, since light required by fingerprint identification is very weak and the photocurrent obtained by the photodiode 200 under the weak light is very low, it is required to equip a thin film transistor with a very low leakage current. A thin film transistor 201 manufactured using an oxide process has a characteristic of a low leakage current, and thus can meet the requirement.

In one implementation, the pixel compensation circuit can comprise a low temperature poly-silicon (LTPS) thin film transistor (TFT). The switch unit of the photosensitive signal collector can comprise an oxide thin film transistor. The oxide thin film transistor can be an Indium Gallium Zinc Oxide (IGZO) thin film transistor.

In one implementation, the photoelectric sensor unit can be arranged above the switch unit.

In one implementation, the photoelectric sensor unit can comprise a photodiode. The photodiode can comprise: a first electrode, a photosensitive material layer and a second electrode. The first electrode is connected with a source of the oxide thin film transistor, and the second electrode is connected with a power supply which provides a constant voltage. A gate of the oxide thin film transistor is connected with a control signal line. A control signal on the control signal line is used for controlling turn-off or turn-on of the oxide thin film transistor. A drain of the oxide thin film transistor is connected with a data reading signal line which is used for collecting a current signal outputted by the photoelectric sensor unit.

In some embodiments, the photodiode can comprise a PIN photodiode or an organic photodiode (OPD), for example.

Figure 5:
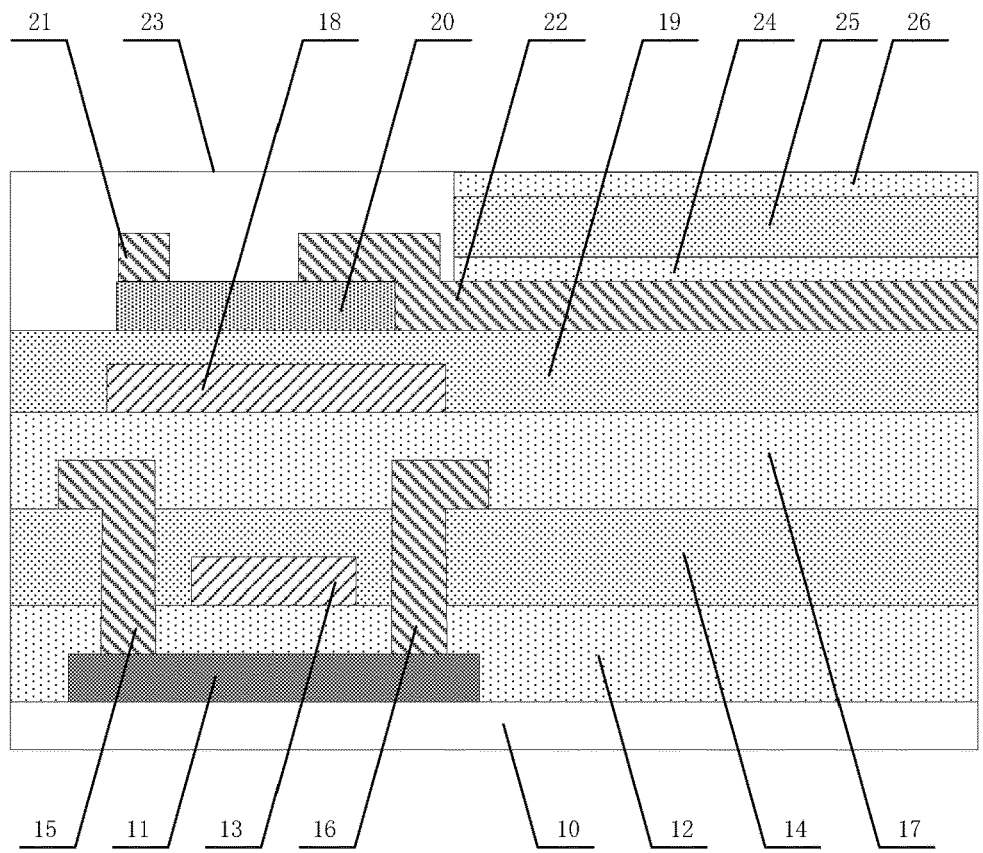
FIG. 5 is a positional schematic view of a photoelectric sensor unit, an oxide thin film transistor and a low temperature poly-silicon thin film transistor of a pixel compensation circuit in an embodiment of this disclosure.

FIG. 5 shows a positional schematic view of a photoelectric sensor unit, an oxide thin film transistor and a low temperature poly-silicon thin film transistor of a pixel compensation circuit in an embodiment of this disclosure. As shown in FIG. 5, the LTPS thin film transistor of the pixel compensation circuit can comprise a poly-silicon active layer 11, a first gate insulator (GI) 12, a first gate 13, an inter layer dielectric (ILD) 14, a first source 15, a first drain 16 and a passivation layer (PVX) 17 arranged on the base 10 successively.

The oxide thin film transistor of the photosensitive signal collector can comprise a second gate 18, a second gate insulator 19, an oxide active layer 20, a second source 22, a second drain 21 and a resin layer 23 arranged successively on the passivation layer 17 of the LTPS thin film transistor.

The photodiode of the photosensitive signal collector can comprise a first electrode 24, a photosensitive material layer 25 and a second electrode 26 arranged successively on the resin layer 23 of the second switch unit.

In one implementation, the electroluminescent diode can comprise an organic light-emitting diode (OLED) or a quantum dot light-emitting diode (QLED).

Figure 6:
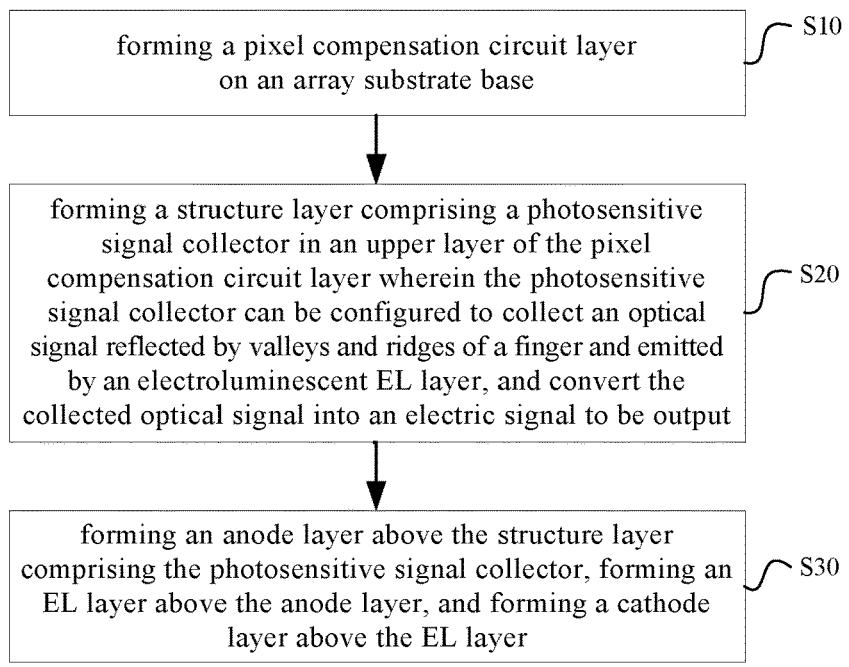
FIG. 6 is a flow chart of a method for manufacturing a display array substrate in an embodiment of this disclosure.

FIG. 6 shows a flow chart of a method for manufacturing a display array substrate in an embodiment of this disclosure. As shown in FIG. 6, the method for manufacturing a display array substrate can comprise the steps of:

Step S10, forming a pixel compensation circuit layer on an array substrate base;

Step S20, forming a structure layer comprising a photosensitive signal collector in an upper layer of the pixel compensation circuit layer wherein the photosensitive signal collector can be configured to collect an optical signal reflected by valleys and ridges of a finger and emitted by an electroluminescent EL layer, and convert the collected optical signal into an electric signal to be output; and Step S30, forming an anode layer above the structure layer comprising the photosensitive signal collector, forming an EL layer above the anode layer, and forming a cathode layer above the EL layer.

In one implementation, the photosensitive signal collector can comprise: a photoelectric sensor unit and a switch unit. The photoelectric sensor unit can be configured to collect an optical signal reflected by valleys and ridges of a finger and emitted by the EL layer, convert the collected optical signal into an electric signal, and output it upon receiving a control signal of the switch unit. The switch unit can be configured to send to the photoelectric sensor unit a control signal which is used for triggering the photoelectric sensor unit to output the electric signal.

In one implementation, the process of forming a pixel compensation circuit layer on the electroluminescent diode array substrate base can further comprise: forming a low temperature poly-silicon thin film transistor on the array substrate base through the following process:

forming a poly-silicon active layer on the array substrate base;

forming a first gate insulator covering the poly-silicon active layer;

forming a first gate on the first gate insulator;

forming an inter layer dielectric covering the first gate;

forming a first source and a first drain on the inter layer dielectric, the first source and the first drain being connected with the poly-silicon active layer through vias arranged on the inter layer dielectric and the first gate insulator; and forming a passivation layer covering the first source and the first drain on the inter layer dielectric.

In one implementation, the process of forming a structure layer comprising a photosensitive signal collector in an upper layer of the pixel compensation circuit layer can further comprise: forming a first structure layer comprising a switch unit in the upper layer of the pixel compensation circuit layer, and forming a second structure layer comprising a photoelectric sensor unit in an upper layer of the first structure layer.

In one implementation, the process of forming a first structure layer comprising a switch unit in the upper layer of the pixel compensation circuit layer can further comprise:

forming a first structure layer comprising an oxide thin film transistor in the upper layer of the pixel compensation circuit layer through the following process:

forming a second gate in the upper layer of the pixel compensation circuit layer;

forming a second gate insulator covering the second gate;

forming an oxide active layer on the second gate insulator;

forming a second source and a second drain in a same layer as the oxide active layer, the second source and the second drain being connected with the oxide active layer;

forming, on the oxide active layer, a resin layer covering the second source and the second drain;

connecting a gate of the oxide thin film transistor with a control signal line, a control signal on the control signal line being used for controlling turn-off or turn-on of the thin film transistor; connecting a drain of the oxide thin film transistor with a data reading signal line which is used for collecting a current signal outputted by the photoelectric sensor unit.

In one implementation, the process of forming a second structure layer comprising a photoelectric sensor unit in an upper layer of the first structure layer can further comprise: forming a second structure layer comprising a photodiode in the upper layer of the first structure layer through the following process:

Successively forming a first electrode, a photosensitive material layer and a second electrode of the photodiode in the upper layer of the first structure layer;

connecting the first electrode of the photodiode with a source of the oxide thin film transistor, and connecting the second electrode of the photodiode with a power supply which provides a constant voltage.

In one implementation, the electroluminescent diode can comprise an organic light-emitting diode (OLED) or a quantum dot light-emitting diode (QLED).

According to another aspect of this disclosure, a display is further provided. The display comprises any display array substrate as described above.

It can be understood that what are stated above are only exemplary implementations of the present invention, however, the protection scope of the present invention is not limited to this. It is noted that, various variations or replacements can be easily conceived by the ordinary skilled person in the art without departing from the spirit and the principle of the present invention. All of these variations or replacements should be encompassed within the protection scope of the present invention. Therefore, the protection scope of the present invention shall be subject to the protection scope of the attached claims.

It is noted that the above embodiments illustrate division of the above functional modules only by way of example. In actual applications, the above functions can be assigned to different functional modules as needed. An internal structure of a device can be divided into different functional modules, so as to implement all or part of the functions described above. Also, the function of one of the above modules can be implemented by a plurality of modules, and the functions of the above multiple modules can also be integrated into one module.

The present application uses wordings such as "first", "second" etc. In the absence of additional context, the use of such wordings is not intended to imply ordering, and actually, they are only used for identification purpose. For example, the phrases of "first electrode" and "second electrode" do not necessarily indicate that the first electrode is located in front of the second electrode spatially, nor indicates that the first electrode is generated or operated before the second electrode temporally. In fact, these phrases are only used for identifying different electrodes.

In the Claims, any reference signs placed in parentheses should not be interpreted as limitations to the claims. The term "comprise" does not exclude presence of elements or steps other than the elements or steps listed in the claims. The word "a/an" or "one" prior to an element does not exclude presence of a plurality of such elements. The present invention can be carried out by means of hardware comprising several separate elements, and can also be carried out through appropriately programmed software or firmware, or through any combinations thereof.

In a device or system claim enumerating several means, one or more of these means can be embodied in a same hardware item. The fact that only some measures are recited in mutually different dependent claims does not indicate that combination of these measures cannot be used advantageously.

The invention claimed is:

1. A display array substrate, comprising:
    an array substrate base;
    an electroluminescent diode array substrate above the array substrate base, the electroluminescent diode array substrate comprising:
    an anode layer;
    a cathode layer;
    an electroluminescent EL layer between the anode layer and the cathode layer; and
    a pixel compensation circuit layer on a side of the electroluminescent diode array substrate facing the array substrate base, wherein the cathode layer is on a side of the electroluminescent diode array substrate facing away from the array substrate base, and
    a plurality of photosensitive signal collectors each configured to receive an optical signal reflected by valleys and ridges of a finger of a user and emitted by the electroluminescent EL layer, and each configured to convert the optical signal into an electrical signal to be output,
    wherein some photosensitive signal collectors of the plurality of photosensitive signal collectors are between and adjacent with the pixel compensation circuit layer and the anode layer of the electroluminescent diode array substrate, and other photosensitive signal collectors of the plurality of photosensitive signal collectors are between and adjacent with the pixel compensation circuit layer and the electroluminescent EL layer.

2. The array substrate according to claim 1, wherein each photosensitive signal collector comprises:
    a photoelectric sensor unit; and
    a switch unit,
    wherein the photoelectric sensor unit is configured to receive the optical signal reflected by the valleys and the ridges of the finger and emitted by the electroluminescent EL layer, convert the optical signal into the electrical signal, and output the electrical signal upon receiving a control signal from the switch unit,
    wherein the switch unit is configured to send the control signal to the photoelectric sensor unit, and
    wherein the control signal triggers the photoelectric sensor unit to output the electrical signal.

3. The array substrate according to claim 2, wherein the photoelectric sensor unit is above the switch unit.

4. The array substrate according to claim 3,
    wherein, the pixel compensation circuit layer comprises a low temperature poly-silicon thin film transistor, and
    wherein the switch unit comprises an oxide thin film transistor.

5. The array substrate according to claim 4, wherein, the photoelectric sensor unit comprises a photodiode comprising:
    a first electrode;
    a photosensitive material layer; and
    a second electrode,
    wherein the first electrode is connected to a source of the oxide thin film transistor, and
    wherein the second electrode is connected with a power supply providing a constant voltage; and
    wherein a gate of the oxide thin film transistor is connected to a control signal line,
    wherein control signal on the control signal line is configured to control turn-off or turn-on of the oxide thin film transistor,
    wherein a drain of the oxide thin film transistor is connected to a data reading signal line configured to receive a current signal output by the photoelectric sensor unit.

6. The array substrate according to claim 1, wherein the plurality of photosensitive signal collectors are distributed in an array in the array substrate.

7. A display comprising the display array substrate according to claim 1.

8. The display according to claim 7, wherein each photosensitive signal collector comprises:
    a photoelectric sensor unit; and
    a switch unit;
    wherein the photoelectric sensor unit is configured to receive the optical signal reflected by valleys and ridges of the finger and emitted by the electroluminescent EL layer, convert the optical signal into an electrical signal, and output the electrical signal upon receiving a control signal from the switch unit; and
    wherein the switch unit is configured to send the control signal to the photoelectric sensor unit, and
    wherein the control signal triggers the photoelectric sensor unit to output the electrical signal.

9. The display according to claim 8, wherein the photoelectric sensor unit is above the switch unit.

10. The display according to claim 9,
    wherein, the pixel compensation circuit layer comprises a low temperature poly-silicon thin film transistor, and
    wherein the switch unit comprises an oxide thin film transistor.

11. The display according to claim 10, wherein, the photoelectric sensor unit comprises a photodiode comprising:
    a first electrode;
    a photosensitive material layer; and
    a second electrode,
    wherein the first electrode is connected to a source of the oxide thin film transistor, and the second electrode is connected with a power supply providing a constant voltage, and
    wherein a gate of the oxide thin film transistor is connected to a control signal line,
    wherein a control signal on the control signal line is configured to control turn-off or turn-on of the oxide thin film transistor, and
    wherein a drain of the oxide thin film transistor is connected to a data reading signal line used for receiving a current signal output by the photoelectric sensor unit.

12. The display according to claim 7, wherein the plurality of photosensitive signal collectors are distributed in an array in the array substrate.

13. A method for manufacturing a display array substrate, comprising:
- forming a pixel compensation circuit layer on an array substrate base;
- forming a structure layer comprising a plurality of photosensitive signal collectors in an upper layer of the pixel compensation circuit layer, each photosensitive signal collector configured to receive an optical signal reflected by valleys and ridges of a finger of a user and emitted by an electroluminescent EL layer, and configured to convert the optical signal that was received into an electrical signal;
- forming an anode layer above the structure layer;
- forming an electroluminescent EL layer above the anode layer; and
- forming a cathode layer above the electroluminescent EL layer,
- wherein some photosensitive signal collectors of the plurality of photosensitive signal collectors are between and adjacent with the pixel compensation circuit layer and the anode layer of the display array substrate, and other photosensitive signal collectors of the plurality of photosensitive signal collectors are between and adjacent with the pixel compensation circuit layer and the electroluminescent EL layer.

14. The method according to claim 13, wherein each photosensitive signal collector comprises:
- a photoelectric sensor unit; and
- a switch unit,
- wherein the photoelectric sensor unit is configured to receive an optical signal reflected by the valleys and the ridges of the finger and emitted by the electroluminescent EL layer, convert the optical signal into the electrical signal, and output the electrical signal upon receiving a control signal from the switch unit; and
- wherein the switch unit is configured to send the control signal to the photoelectric sensor unit,
- wherein the control signal triggers the photoelectric sensor unit to output the electrical signal.

15. The method according to claim 14, wherein forming the structure layer in the upper layer of the pixel compensation circuit layer comprises:
- forming a first structure layer comprising the switch unit in the upper layer of the pixel compensation circuit layer; and
- forming a second structure layer comprising the photoelectric sensor unit in an upper layer of the first structure layer.

16. The method according to claim 15, wherein forming the first structure layer in the upper layer of the pixel compensation circuit layer comprises:

forming the first structure layer comprising an oxide thin film transistor in the upper layer of the pixel compensation circuit layer by performing operations comprising:
- forming a second gate in the upper layer of the pixel compensation circuit layer;
- forming a second gate insulator covering the second gate;
- forming an oxide active layer on the second gate insulator;
- forming a second source and a second drain in the oxide active layer, the second source and the second drain electrically connected to the oxide active layer;
- forming, on the oxide active layer, a resin layer covering the second source and the second drain;
- connecting a gate of the oxide thin film transistor with a control signal line, the control signal on the control signal line configured to control turn-off or turn-on of the oxide thin film transistor; and
- connecting a drain of the oxide thin film transistor with a data reading signal line configured to receive a current signal output by the photoelectric sensor unit.

17. The method according to claim 16, wherein the forming the second structure layer comprises:
forming the second structure layer comprising a photodiode in the upper layer of the first structure layer by performing operations comprising:
- successively forming a first electrode of the photodiode, a photosensitive material layer of the photodiode, and a second electrode of the photodiode in the upper layer of the first structure layer;
- connecting the first electrode of the photodiode with a source of the oxide thin film transistor; and
- connecting the second electrode of the photodiode with a power supply providing a constant voltage.

18. The method according to claim 13, wherein the forming the pixel compensation circuit layer on the array substrate base comprises:
forming a low temperature poly-silicon thin film transistor on the array substrate base by performing operations comprising:
- forming a poly-silicon active layer on the array substrate base;
- forming a first gate insulator covering the poly-silicon active layer;
- forming a first gate on the first gate insulator;
- forming an inter layer dielectric covering the first gate;
- forming a first source and a first drain on the inter layer dielectric, wherein the first source and the first drain are connected to the poly-silicon active layer through vias on the inter layer dielectric and the first gate insulator; and
- forming, on the inter layer dielectric, a passivation layer covering the first source and the first drain.

* * * * *